United States Patent
Yoshida et al.

(10) Patent No.: US 11,465,299 B2
(45) Date of Patent: Oct. 11, 2022

(54) STATE MONITORING SYSTEM AND STATE MONITORING METHOD

(71) Applicant: KAWASAKI JUKOGYO KABUSHIKI KAISHA, Kobe (JP)

(72) Inventors: Masaya Yoshida, Himeji (JP); Hiroyuki Okada, Kakogawa (JP); Kazuo Fujimori, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 220 days.

(21) Appl. No.: 16/636,444

(22) PCT Filed: Jul. 31, 2018

(86) PCT No.: PCT/JP2018/028616
§ 371 (c)(1),
(2) Date: Feb. 4, 2020

(87) PCT Pub. No.: WO2019/026896
PCT Pub. Date: Feb. 7, 2019

(65) Prior Publication Data
US 2020/0246985 A1    Aug. 6, 2020

(30) Foreign Application Priority Data
Aug. 4, 2017 (JP) .............................. JP2017-151636

(51) Int. Cl.
*B25J 19/06* (2006.01)
*G05B 19/406* (2006.01)
(Continued)

(52) U.S. Cl.
CPC ............. *B25J 19/06* (2013.01); *B25J 9/1651* (2013.01); *B25J 9/1653* (2013.01); *B25J 9/1674* (2013.01);
(Continued)

(58) Field of Classification Search
CPC ...... B25J 9/1674; B25J 11/0095; B25J 13/08; B25J 19/06; B25J 9/1697; B25J 19/00;
(Continued)

(56) References Cited

U.S. PATENT DOCUMENTS 10,471,597 B1 * 11/2019 Murphy ............... B65G 1/1378
11,175,056 B1 * 11/2021 Stevenson ............... F24F 7/007
(Continued)

FOREIGN PATENT DOCUMENTS

JP    S60-016395 A    1/1985
JP    2002-246443 A    8/2002
(Continued)

*Primary Examiner* — Yoshihisa Ishizuka
*Assistant Examiner* — Carter W Ferrell
(74) *Attorney, Agent, or Firm* — Oliff PLC

(57) ABSTRACT

A state monitoring system for monitoring a state of a robot configured to perform work on a workpiece executes: a step of obtaining state data from a sensor and deriving a deterioration index parameter based on the obtained state data; a step of determining whether or not the deterioration index parameter is greater than a first threshold that is preset to a level lower than a level at which corrective maintenance is required; a step of further determining whether or not a frequency of having determined that the deterioration index parameter is greater than the first threshold is greater than a preset frequency threshold; and a step of suppressing an operation of the robot without stopping the robot if it is determined that the frequency is greater than the frequency threshold.

16 Claims, 5 Drawing Sheets

(51) Int. Cl.
*B25J 9/16* (2006.01)
*B25J 11/00* (2006.01)
*H01L 21/677* (2006.01)
*B25J 15/06* (2006.01)
*B25J 19/02* (2006.01)
*B25J 13/08* (2006.01)

(52) U.S. Cl.
CPC ......... *B25J 9/1694* (2013.01); *B25J 11/0095* (2013.01); *B25J 15/0616* (2013.01); *B25J 19/02* (2013.01); *G05B 19/406* (2013.01); *H01L 21/677* (2013.01); *B25J 13/08* (2013.01); *G05B 2219/39413* (2013.01)

(58) Field of Classification Search
CPC ...... B25J 19/406; B25J 9/1651; B25J 9/1653; B25J 9/1694; B25J 15/0616; B25J 19/02; G05B 2219/39413; G05B 23/0232; G05B 23/0283; G05B 9/02; G05B 19/406; G05B 19/042; G05B 2219/34013; G05B 2219/40202; G05B 2219/45031; G05B 2219/24015; H01L 21/677; H01L 21/67742; H01L 21/67766; H01L 21/681; H01L 21/67259; H01L 21/68707; H01L 21/67264; H01L 21/67288; H01L 21/68; H01L 21/67748; H01L 21/67778; H01L 21/67781; H01L 2223/54493; H01L 23/544; H01L 21/67196; H01L 21/682; H01L 21/67253; H01L 21/02057; H01L 21/67023; H01L 21/67051; H01L 21/67167; H01L 21/67201; H01L 21/67276; H01L 21/67706; H01L 21/67718; H01L 21/67727; H01L 21/67733; H01L 21/67736; H01L 21/67745; H01L 21/67769; H01L 21/67772; H01L 21/687; H01L 21/67775; H01L 22/20; H01L 2221/68368; H01L 2223/54426; H01L 21/67011; H01L 21/67739; H01L 21/67751; H01L 21/6838; Y10S 901/09

See application file for complete search history.

(56) References Cited

U.S. PATENT DOCUMENTS

| | | | |
|---|---|---|---|
| 2008/0013089 A1* | 1/2008 | Ishii | G03F 9/7011 356/400 |
| 2012/0253511 A1* | 10/2012 | Saeki | H01L 21/67742 700/245 |
| 2012/0257176 A1* | 10/2012 | Hayashi | G03F 7/162 355/27 |
| 2012/0328402 A1* | 12/2012 | Trujillo | B25J 9/1612 414/730 |
| 2016/0156288 A1* | 6/2016 | Sawamura | G05B 19/406 318/372 |
| 2016/0293462 A1 | 10/2016 | Matsushita | |
| 2017/0102000 A1* | 4/2017 | Okuaki | F04D 29/325 |
| 2017/0108841 A1* | 4/2017 | Nicks | G06K 9/00671 |
| 2018/0045206 A1* | 2/2018 | Birk | F04D 27/001 |

FOREIGN PATENT DOCUMENTS

| | | |
|---|---|---|
| JP | 2016-192532 A | 11/2016 |
| JP | 2016-221582 A | 12/2016 |

\* cited by examiner

STATE MONITORING SYSTEM AND STATE MONITORING METHOD

TECHNICAL FIELD

The present invention relates to a state monitoring system for and a state monitoring method of monitoring the state of a robot that performs work on a workpiece.

BACKGROUND ART

Conventionally, there are known state monitoring systems for monitoring the state of a robot that performs work on a workpiece. For example, such a state monitoring system adopts an abnormality detection method and a production control method disclosed by Patent Literature 1.

The abnormality detection method of Patent Literature 1 includes: a first process in which a controller causes a robotic arm to perform assembling operations a plurality of times by using checking components whose mounting precision has been confirmed, while recording outputs from an inner force sensor; and a second process in which to detect an abnormality in the robotic arm based on results of evaluation of changes in the outputs from the inner force sensor, the outputs being recorded for each of the plurality of times of assembling operations performed in the first step. Also, in the production control method of Patent Literature 1, when the outputs from the inner force sensor have deviated from a normal range during a normal production process, an operation check of the robotic apparatus is performed by utilizing the above abnormality detection method.

CITATION LIST

Patent Literature

PTL 1: Japanese Laid-Open Patent Application Publication No. 2016-221582

SUMMARY OF INVENTION

Technical Problem

Patent Literature 1 describes that, in order to shift to an operation check mode for detecting an abnormality in the robotic arm, particular statistics indicating deviation from a normal level are used. Examples of such statistics include the number of times or how frequently an alarming level has been reached. Patent Literature 1 also describes that when the alarming level is reached, a user is notified that it is necessary to perform predictive maintenance work. However, the technique disclosed by Patent Literature 1 merely gives such a notification to the user, and each time the user is given the notification, the user needs to perform the maintenance work. This causes increase in the maintenance work load.

In view of the above, an object of the present invention is to provide a state monitoring system and a state monitoring method that make it possible to reduce the work load of maintenance work performed for a robot.

Solution to Problem

In order to solve the above-described problems, a state monitoring system according to the present invention is a state monitoring system for monitoring a state of a robot configured to perform work on a workpiece, and includes: a sensor configured to obtain state data that indicates either a state of a component included in the robot or a state of the workpiece; and a monitoring unit configured to monitor a state of the robot by using a deterioration index parameter that is based on the state data. The monitoring unit executes: obtaining the state data from the sensor and deriving the deterioration index parameter based on the obtained state data; determining whether or not the deterioration index parameter is greater than a first threshold that is preset to a level lower than a level at which corrective maintenance is required; further determining whether or not a frequency of having determined that the deterioration index parameter is greater than the first threshold is greater than a preset frequency threshold; and suppressing an operation of the robot without stopping the robot if it is determined that the frequency is greater than the frequency threshold.

According to the above configuration, when an abnormality of a level lower than the level at which corrective maintenance is required has occurred, the necessity for a user to perform such work as predictive maintenance can be eliminated by suppressing the operation of the robot without stopping the robot. This consequently makes it possible to provide the state monitoring system, which makes it possible to reduce the work load of maintenance work performed for the robot.

For example, the monitoring unit may execute suppressing the operation of the robot without stopping the robot by reducing a speed or acceleration of the robot.

For example, the frequency threshold may be a preset threshold relating to the number of times the deterioration index parameter becomes greater than the first threshold while the robot repeats performing the work a predetermined number of times.

For example, the frequency threshold may be a preset threshold relating to the number of times the deterioration index parameter becomes greater than the first threshold during a predetermined time.

The robot may include: a robotic arm; an end effector mounted to the robotic arm, the end effector being configured to hold the workpiece and perform the work on the held workpiece; and a robot controller configured to control the robotic arm and the end effector. The state data may be holding state data that indicates whether or not the end effector is holding the workpiece. The deterioration index parameter may be an amount of deviation from a predetermined time that is required from when the robot controller has transmitted instruction data to instruct the end effector to hold the workpiece until when the robot controller receives the holding state data indicating that the end effector is holding the workpiece.

According to the above configuration, when an abnormality of a level lower than the level at which corrective maintenance is required has occurred in, for example, a mechanism of the end effector for holding the workpiece, the necessity for the user to perform such work as predictive maintenance can be eliminated by suppressing the operation of the robot without stopping the robot.

The end effector may move a piston in a cylinder to hold the workpiece by chucking, and the sensor may be a position sensor configured to detect a position of the piston in the cylinder.

According to the above configuration, when an abnormality of a level lower than the level at which corrective maintenance is required has occurred in, for example, a mechanism of the end effector for holding the workpiece by chucking, the necessity for the user to perform such work as predictive maintenance can be eliminated by suppressing the operation of the robot without stopping the robot.

The end effector may reduce an internal pressure of a suction part to hold the workpiece by suction, and the sensor may be a pressure sensor configured to detect the internal pressure of the suction part.

According to the above configuration, when an abnormality of a level lower than the level at which corrective maintenance is required has occurred in, for example, a mechanism of the end effector for holding the workpiece by suction, the necessity for the user to perform such work as predictive maintenance can be eliminated by suppressing the operation of the robot without stopping the robot.

The robot may include a fan including a plurality of vanes. The sensor may be a fan sensor configured to detect whether or not the plurality of vanes have rotated and passed a predetermined position in the fan. The deterioration index parameter may be an amount of deviation from a predetermined number of rotations that indicates the number of rotations to be made by the plurality of vanes during a predetermined time.

According to the above configuration, when an abnormality of a level lower than the level at which corrective maintenance is required has occurred in the fan, the necessity for the user to perform such work as predictive maintenance can be eliminated by suppressing the operation of the robot without stopping the robot.

The sensor may be an encoder configured to detect a rotational position of a motor. The deterioration index parameter may be an amount of deviation between the rotational position of the motor when the motor is stopped from rotating and the rotational position of the motor when a predetermined time has elapsed after the motor is stopped from rotating.

According to the above configuration, when an abnormality of a level lower than the level at which corrective maintenance is required has occurred in, for example, a mechanism that has an influence on the rotational position of the motor, the necessity for the user to perform such work as predictive maintenance can be eliminated by suppressing the operation of the robot without stopping the robot.

The sensor may be a mapping sensor configured to detect mapping data that indicates a placement state of the workpiece. The deterioration index parameter may be an amount of deviation between the mapping data and a predetermined placement state of the workpiece.

According to the above configuration, when an abnormality of a level lower than the level at which corrective maintenance is required has occurred in, for example, a mechanism that has an influence on the placement state of the workpiece, the necessity for the user to perform such work as predictive maintenance can be eliminated by suppressing the operation of the robot without stopping the robot.

The workpiece may be a semiconductor wafer, and the robot may be installed in a clean room.

According to the above configuration, when an abnormality of a level lower than the level at which corrective maintenance is required has occurred in the robot installed in the clean room where the robot performs the work on the semiconductor wafer, the necessity for the user to perform such work as predictive maintenance can be eliminated by suppressing the operation of the robot without stopping the robot.

In suppressing the operation of the robot without stopping the robot, the monitoring unit may additionally output an alarm.

According to the above configuration, when an abnormality of a level lower than the level at which corrective maintenance is required has occurred, the operation of the robot can be suppressed without stopping the robot, and also, the user can be notified of the abnormality.

The monitoring unit may execute: further determining whether or not the deterioration index parameter is greater than a second threshold that is preset to the level at which corrective maintenance is required, and stopping the robot if it is determined that the deterioration index parameter is greater than the second threshold.

According to the above configuration, when an abnormality of the level at which corrective maintenance is required has occurred, the robot can be stopped safely.

In stopping the robot, the monitoring unit may additionally output an alarm.

According to the above configuration, when an abnormality of the level at which corrective maintenance is required has occurred, the robot can be stopped safely, and also, the user can be notified of the abnormality.

The state monitoring system may further include: a storage device configured to store history data of results of execution by the monitoring unit; and an output device configured to output the history data.

According to the above configuration, the history data stored in the storage device can be referred to by the output device.

In order to solve the above-described problems, a state monitoring method according to the present invention is a state monitoring method of monitoring a state of a robot configured to perform work on a workpiece, and includes: obtaining state data from a sensor and deriving a deterioration index parameter based on the obtained state data, the state data indicating either a state of a component included in the robot or a state of the workpiece; determining whether or not the deterioration index parameter is greater than a first threshold that is preset to a level lower than a level at which corrective maintenance is required; further determining whether or not a frequency of having determined that the deterioration index parameter is greater than the first threshold is greater than a preset frequency threshold; and suppressing an operation of the robot without stopping the robot if it is determined that the frequency is greater than the frequency threshold.

According to the above configuration, when an abnormality of a level lower than the level at which corrective maintenance is required has occurred, the necessity for a user to perform such work as predictive maintenance can be eliminated by suppressing the operation of the robot without stopping the robot. This consequently makes it possible to provide the state monitoring method, which makes it possible to reduce the work load of maintenance work performed for the robot.

Advantageous Effects of Invention

The present invention makes it possible to provide a state monitoring system and a state monitoring method that make it possible to reduce the work load of maintenance work performed for a robot.

DESCRIPTION OF EMBODIMENTS

1. Embodiment 1

Figure 1:
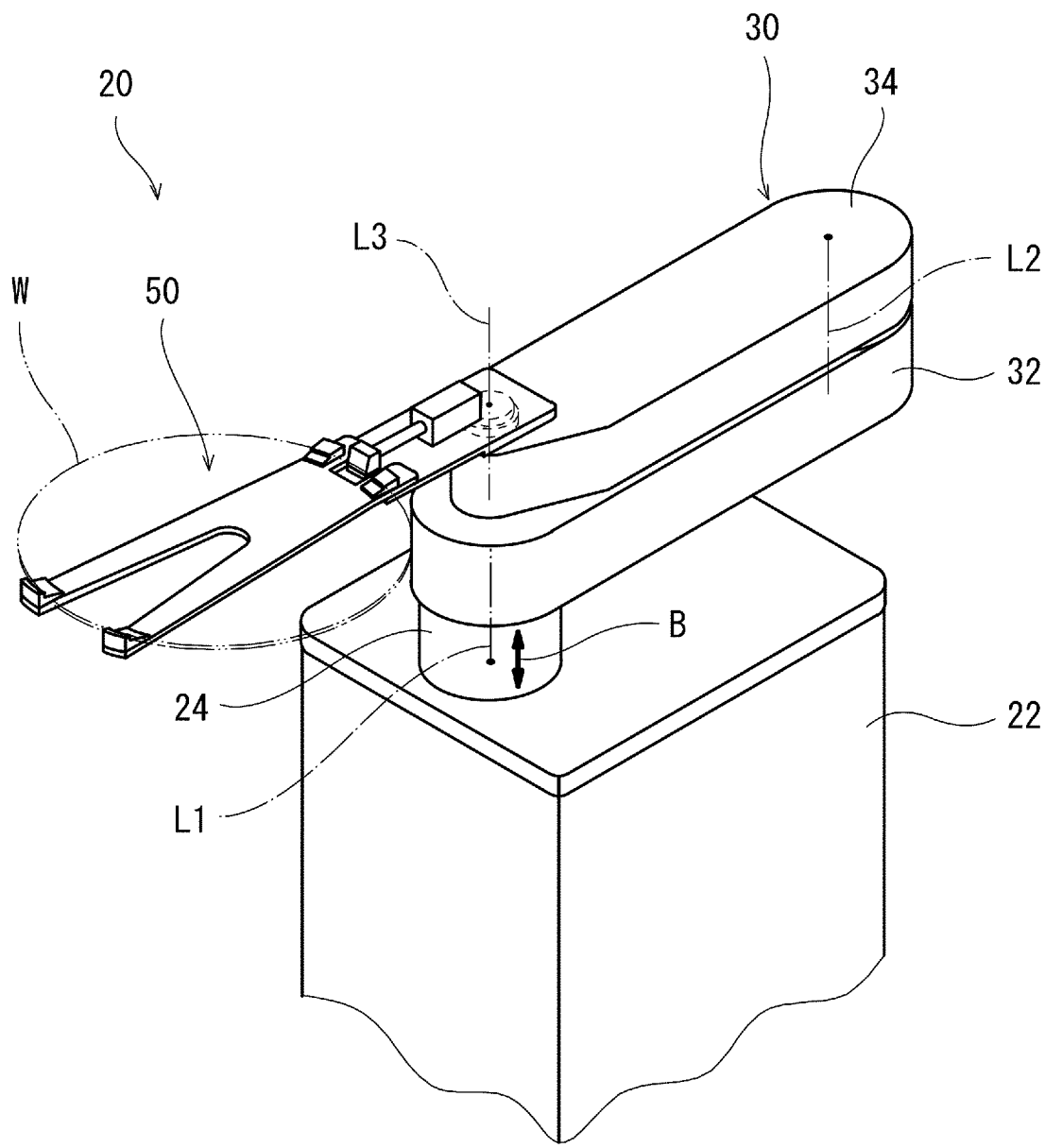
FIG. 1 is an external perspective view of a robot to which a state monitoring system according to Embodiment 1 of the present invention is applied, the robot being configured to hold a semiconductor wafer by chucking.
Figure 2:
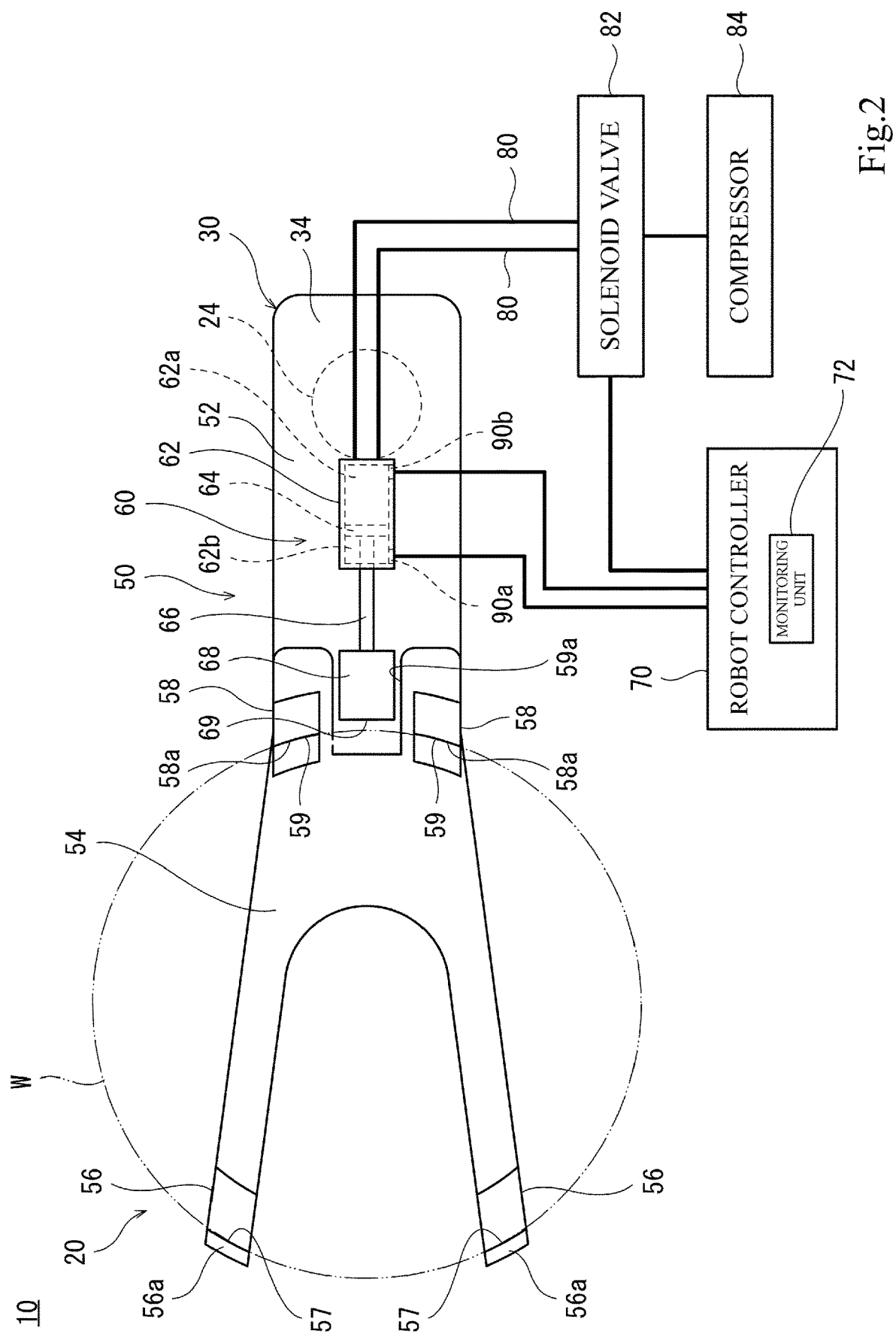
FIG. 2 is a schematic block diagram showing the configuration of an essential part of the robot, to which the state monitoring system according to Embodiment 1 of the present invention is applied, the robot being configured to hold a semiconductor wafer by chucking.
Figure 3:
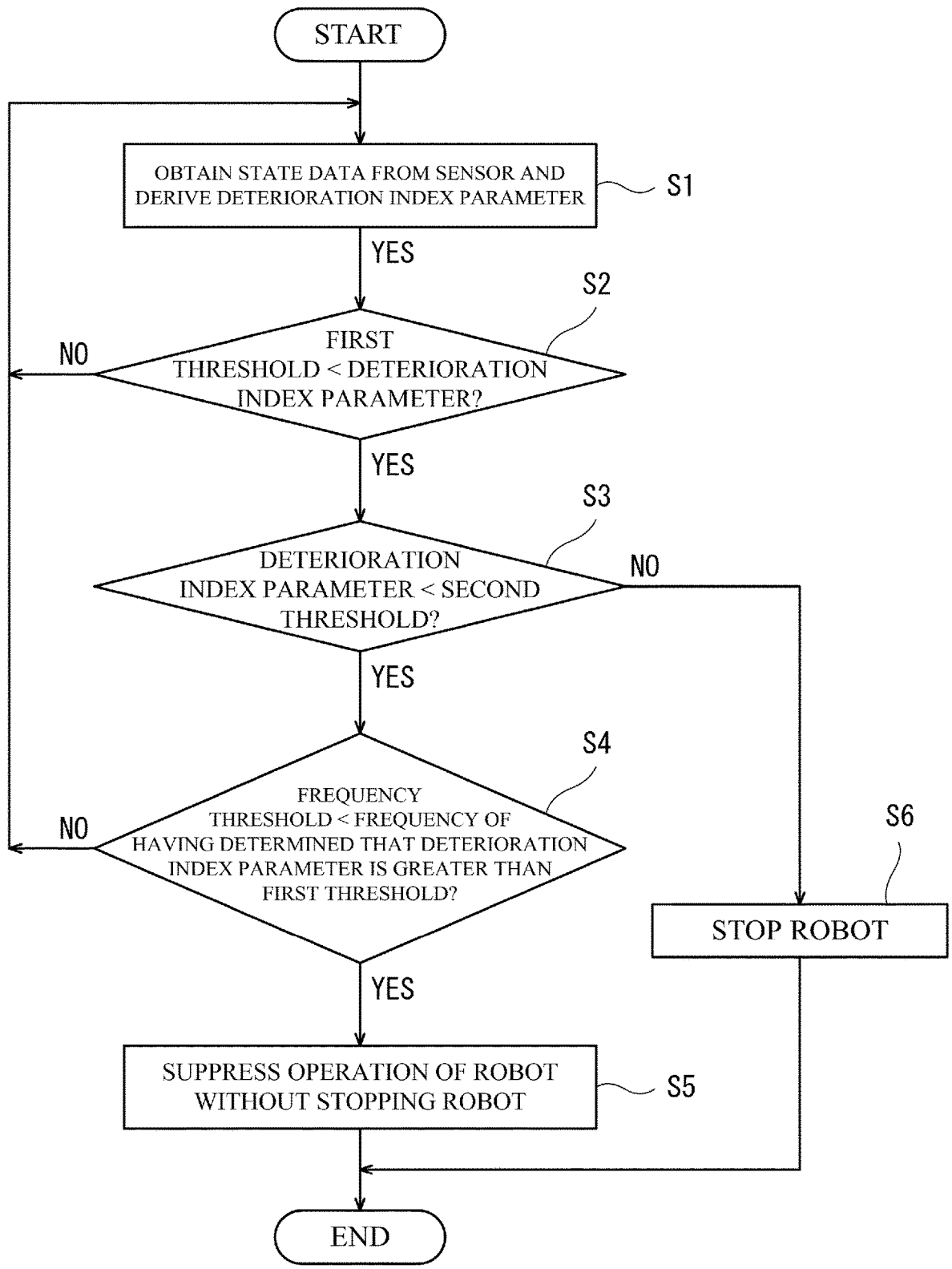
FIG. 3 is a flowchart showing processes executed by the state monitoring system according to Embodiment 1 of the present invention.

Hereinafter, embodiments of the present invention are described with reference to the accompanying drawings. In the drawings, the same or corresponding elements are denoted by the same reference signs, and repeating the same descriptions is avoided below. FIG. 1 is an external perspective view of a robot to which a state monitoring system according to Embodiment 1 of the present invention is applied, the robot being configured to hold a semiconductor wafer by chucking. FIG. 2 is a schematic block diagram showing the configuration of an essential part of the robot. FIG. 3 is a flowchart showing processes executed by the state monitoring system according to Embodiment 1 of the present invention.

State Monitoring System 10

The state monitoring system 10 according to Embodiment 1 of the present invention is a system for monitoring the state of a robot 20, which is configured to perform work on a semiconductor wafer W (workpiece). The state monitoring system 10 includes: an advancement sensor 90a and a retraction sensor 90b (sensor) described below, the advancement sensor 90a and the retraction sensor 90b each being configured to obtain state data indicating the state of a component included in the robot 20; and a monitoring unit 72 configured to monitor the state of the robot 20 by using a deterioration index parameter that is based on the state data.

Robot 20

The robot 20 is a robot configured to hold and transfer a semiconductor wafer W, which is indicated by two-dot chain line in FIG. 1 and FIG. 2. For example, semiconductor processing equipment is equipped with the robot 20, and the robot 20 is installed in a clean room. In the present invention, the semiconductor wafer W is a thin plate used in semiconductor processing, and is defined as a material serving as the substrate of a semiconductor device.

The robot 20 includes: a robotic arm 30; an end effector 50 mounted to the robotic arm 30, the end effector 50 being configured to hold the semiconductor wafer W and perform work on the held semiconductor wafer W; and a robot controller 70 configured to control the robotic arm 30 and the end effector 50.

As shown in FIG. 1, the robot 20 is a horizontal articulated three-axis robot, and includes a base 22 fixed to the casing of the semiconductor processing equipment. The base 22 is provided with a lifting/lowering shaft 24 configured to extend/retract in the up-down direction (indicated by an arrow B in FIG. 1). The lifting/lowering shaft 24 is configured to be extendable/retractable by means of, for example, an unshown air cylinder. The robotic arm 30 is mounted to the upper end of the lifting/lowering shaft 24, which is extendable/retractable.

Robotic Arm 30

The robotic arm 30 includes a first arm 32 and a second arm 34, each of which is constituted by an elongated member extending in the horizontal direction.

One end of the first arm 32 in the longitudinal direction thereof is mounted to the lifting/lowering shaft 24, such that the first arm 32 is rotatable about a vertical axis L1. The first arm 32 is configured such that the first arm 32 can be driven by an unshown electric motor to rotate. The second arm 34 is mounted to the other end of the first arm 32 in the longitudinal direction thereof.

One end of the second arm 34 in the longitudinal direction thereof is mounted to the first arm 32, such that the second arm 34 is rotatable about a vertical axis L2. The second arm 34 is configured such that the second arm 34 can be driven by an unshown electric motor to rotate. The end effector 50 is mounted to the other end of the second arm 34 in the longitudinal direction thereof, such that the end effector 50 is rotatable about a vertical axis L3. The end effector 50 is configured such that the end effector 50 can be driven by an unshown electric motor to rotate. The lifting/lowering of the lifting/lowering shaft 24, the rotation of the first arm 32, the rotation of the second arm 34, and the rotation of the end effector 50 are controlled by the robot controller 70.

End Effector 50

The end effector 50 includes: a mounting plate 52, which is rotatably mounted to the upper surface of the second arm 34; and an end effector body 54 mounted to the mounting plate 52.

The end effector body 54 includes two branched distal end portions, such that the end effector body 54 is in a Y shape when seen in plan view. The proximal end portion of the end effector body 54 is fixed to the mounting plate 52. First receivers 56 are provided at the respective two branched distal end portions of the end effector body 54. A pair of second receivers 58 is provided at the proximal end portion of the end effector body 54, such that the pair of second receivers 58 faces the pair of first receivers 56. The pair of first receivers 56 and the pair of second receivers 58 have a function of supporting the semiconductor wafer W. Therefore, these receivers are formed in suitable shapes at suitable positions in accordance with the shape of the semiconductor wafer W, such that the receivers can properly support the semiconductor wafer W. The semiconductor wafer W may be in any shape. The description herein gives examples in which the semiconductor wafer W has a circular shape as indicated by two-dot chain line in FIG. 1 and FIG. 2.

Each of the pair of first receivers 56 includes a clamp portion 56a disposed at the distal end of the end effector body 54. The clamp portion 56a extends upward, and faces a pusher 68, which will be described below. The pair of second receivers 58 is provided such that the second receivers 58 are spaced apart from each other in the width direction of the end effector body 54. Each of the pair of second receivers 58 includes a step 58a extending in the up-down direction, and also includes a facing surface 59, which is formed by the step 58a. The facing surfaces 59 face facing surfaces 57 of the clamp portions 56a. The facing surfaces 57 of the first receivers 56 and the facing surfaces 59 of the second receivers 58 are each shaped corresponding to the edge of the semiconductor wafer W (i.e., arc-shaped), and are configured such that the semiconductor wafer W fits between these surfaces.

The mounting plate 52 of the end effector 50 is provided with a pushing mechanism 60. The pushing mechanism 60 is configured to be able to push the semiconductor wafer W toward the facing surfaces 57 of the clamp portions 56a. Specifically, the pushing mechanism 60 includes a cylinder 62. The cylinder 62 is provided at the center of the mounting plate 52. A rod 66 is inserted in the cylinder 62, such that the rod 66 is advanceable and retractable. A piston 64 is formed on one end of the rod 66. The piston 64 divides the interior of the cylinder 62 into two spaces, which are first and second spaces 62a and 62b. The rod 66 advances when air is fed to the first space 62a, and retracts when air is fed to the second space 62b.

The cylinder 62 is connected to air hoses 80, each of which is configured to feed compressed air into the cylinder 62. The air hoses 80 are connected to a solenoid valve 82, and the solenoid valve 82 is connected to a compressor 84 and the robot controller 70. In accordance with instruction data from the robot controller 70, the solenoid valve 82 switches the air hose to which the compressed air is to be outputted between a piston-advancing air hose 80 and a piston-retracting air hose 80. The piston-advancing air hose 80 is configured to cause the piston 64 to advance (i.e., feed the air to the first space 62a). The piston-retracting air hose 80 is configured to cause the piston 64 to retract (i.e., feed the air to the second space 62b).

The pusher 68 is in a roughly rectangular parallelepiped shape. One side surface of the pusher 68 is fixed to the rod 66. Another side surface of the pusher 68 opposite to the one side surface serves as a pushing surface 69. The pushing surface 69 is sloped in a manner to widen downward. The pusher 68 thus configured is disposed in a through groove 59a, which is formed between the pair of second receivers 58. The through groove 59a extends from the proximal end of the end effector body 54 to the distal end side thereof. The pusher 68 is disposed such that the pusher 68 advances/retracts within the through groove 59a in accordance with advancement/retraction of the rod 66.

The pushing surface 69 of the pusher 68 thus configured is, when the rod 66 is in a fully retracted state, positioned at the proximal end side of the end effector body 54 relative to the steps 58a, i.e., positioned rearward of the steps 58a. On the other hand, when the rod 66 is in a fully advanced state, the pushing surface 69 is positioned at the distal end side of the end effector body 54 relative to the steps 58a, i.e., positioned forward of the steps 58a.

The pusher 68 is configured to: push the semiconductor wafer W toward the clamp portions 56a of the pair of first receivers 56 as a result of the rod 66 being caused to advance; and chuck the semiconductor wafer W together with the clamp portions 56a, thereby holding the semiconductor wafer W.

The advancement sensor 90a is a position sensor configured to be turned ON and transmit a signal to the monitoring unit 72 when the piston 64 has reached the front end within the cylinder 62. On the other hand, the retraction sensor 90b is a position sensor configured to be turned ON and transmit a signal to the monitoring unit 72 when the piston 64 is retracted within the cylinder 62. The monitoring unit 72 detects, by receiving the signal from the advancement sensor 90a, that the pusher 68 is pushing the semiconductor wafer W toward the pair of clamp portions 56a. That is, the monitoring unit 72 detects, by receiving the signal from the advancement sensor 90a, that the end effector 50 is holding the semiconductor wafer W by chucking.

Monitoring Unit 72

The monitoring unit 72 according to the present embodiment is included in the robot controller 70. Specific configurations of the monitoring unit 72 and the robot controller 70 are not particularly limited. For example, the monitoring unit 72 and the robot controller 70 may be realized as a result of a known processor (e.g., CPU) operating in accordance with a program stored in a storage unit (memory). The monitoring unit 72 monitors the state of the robot 20 by using a deterioration index parameter that is based on position data (state data) of the piston 64. In the present embodiment, the position data (state data) also serves as holding state data that indicates whether or not the end effector 50 is holding the semiconductor wafer W (workpiece) by chucking. The deterioration index parameter is the amount of deviation from a predetermined time that is required from when the robot controller 70 has transmitted instruction data to instruct the end effector 50 to hold the semiconductor wafer W until when the robot controller 70 receives the holding state data indicating that the end effector 50 is holding the semiconductor wafer W.

Hereinafter, one example of processes executed by the monitoring unit 72, and the details of the state data and the deterioration index parameter, are described mainly with reference to FIG. 3.

First, the monitoring unit 72 obtains the position data (state data) of the piston 64 within the cylinder 62 from the advancement sensor 90a and the retraction sensor 90b (sensor), and derives a deterioration index parameter based on the obtained data (step S1).

Specifically, when the piston 64 is retracted within the cylinder 62, the retraction sensor 90b is turned ON, and a signal from the retraction sensor 90b is transmitted to the monitoring unit 72. At the time, the semiconductor wafer W is in the state of not being held by the end effector 50. In this state, the robot controller 70 transmits instruction data to the solenoid valve 82 to cause the piston 64 to advance, and concurrently starts a timer.

Upon receiving the instruction data, the solenoid valve 82 performs a changeover of the valve to feed compressed air to the first space 62a in the cylinder 62 through the piston-advancing air hose 80. As a result, the piston 64 advances within the cylinder 62. When the piston 64 reaches the front end within the cylinder 62, the advancement sensor 90a is turned ON, and a signal from the advancement sensor 90a is transmitted to the monitoring unit 72. The monitoring unit 72 receives the signal from the advancement sensor 90a, and reads the timer value at the time. In the present embodiment, the amount of deviation of the timer value read at the time from the predetermined time serves as the deterioration index parameter.

Next, the monitoring unit 72 determines whether or not the amount of deviation from the predetermined time (i.e., the deterioration index parameter) is greater than a first threshold that is preset to a level lower than a level at which corrective maintenance is required (step S2). Here, if an abnormality occurs in, for example, any of the compressed air feeding system from the compressor 84 to the air hoses 80, the pushing mechanism 60 including components such as the cylinder 62 and the piston 64, and the advancement sensor 90*a* and the retraction sensor 90*b*, the aforementioned timer value deviates from a predetermined value, i.e., becomes shorter or longer than the predetermined value. In the present embodiment, the upper limit value and the lower limit value of an allowable amount of deviation at the time from the predetermined time (the allowable amount of deviation is preset to a level lower than the level at which corrective maintenance is required) serve as the first threshold.

The monitoring unit 72 further determines whether or not the amount of deviation from the predetermined time (i.e., the deterioration index parameter) is greater than a second threshold that is preset to the level at which corrective maintenance is required (step S3).

If it is determined in step S2 that the amount of deviation from the predetermined time is greater than the first threshold (i.e., first threshold<deterioration index parameter), and determined in step S3 that the amount of deviation from the predetermined time is not great than the second threshold (i.e., deterioration index parameter<second threshold), the monitoring unit 72 further determines whether or not the frequency of having determined that the amount of deviation from the predetermined time is greater than the first threshold is greater than a preset frequency threshold (step S4). The frequency threshold in the present embodiment is a preset threshold relating to the number of times the amount of deviation from the predetermined time (i.e., the deterioration index parameter) becomes greater than the first threshold while the robot 20 holds the semiconductor wafer W by chucking a predetermined number of times (while the robot repeats performing the work a predetermined number of times).

Lastly, if the monitoring unit 72 determines in step S4 that the above frequency is greater than the frequency threshold (i.e., frequency threshold<frequency of having determined that the deterioration index parameter is greater than the first threshold), the robot controller 70 receives that information, and in response thereto, suppresses the operation of the robot 20 without stopping the robot 20 (step S5). Suppressing the operation of the robot 20 without stopping the robot 20 herein may be realized, for example, by reducing the speed or acceleration of the robot 20. Alternatively, in the case of performing error handling when no signal is received after a predetermined waiting time has elapsed, suppressing the operation of the robot 20 without stopping the robot 20 may be realized by extending the predetermined waiting time. Further alternatively, suppressing the operation of the robot 20 without stopping the robot 20 may be realized by extending a waiting time from when a predetermined first operation has been completed until when a predetermined second operation is started. Yet further alternatively, suppressing the operation of the robot 20 without stopping the robot 20 may be realized by lowering the degree of compliance control. It should be noted that in the case where suppressing the operation of the robot 20 without stopping the robot 20 is realized by reducing the speed of the robot 20, the speed of the entire robot 20 may be reduced, or only the speed of the end effector 50 may be reduced. In step S5, additionally, an alarm may be outputted. Outputting the alarm may be performed, for example, by outputting a sound from a speaker, outputting character data or the like on a display, or outputting both the sound and the character data.

It should be noted that both in a case where it is determined in step S2 that the amount of deviation from the predetermined time is not greater than the first threshold (i.e., first threshold≥deterioration index parameter) and in a case where it is determined in step S4 that the frequency of having determined that the amount of deviation from the predetermined time is greater than the first threshold is not greater than the frequency threshold (i.e., frequency threshold≥frequency of having determined that the deterioration index parameter is greater than the first threshold), the flow returns to step S1, and the same processing is executed again. If it is determined in step S3 that the amount of deviation from the predetermined time is greater than or equal to the second threshold (i.e., deterioration index parameter≥second threshold), the robot controller 70 receives that information, and in response thereto, stops the robot 20 (step S6). In step S6, additionally, an alarm may be outputted. Since the outputting of the alarm is performed in step S6 in the same manner as in step S5, the description thereof is not repeated herein.

Advantageous Effects

The state monitoring system 10 according to the present embodiment obtains the position data of the piston 64 within the cylinder 62 of the end effector 50 from the advancement sensor 90*a* and the retraction sensor 90*b* (i.e., obtains the holding state data that indicates whether or not the end effector 50 is holding the semiconductor wafer W by chucking), and derives the deterioration index parameter based on the obtained data. Then, if the frequency of having determined that the deterioration index parameter is greater than the first threshold, which is preset to the level lower than the level at which corrective maintenance is required, is greater than the preset frequency threshold, the state monitoring system 10 suppresses the operation of the robot 20 without stopping the robot 20. Since the operation of the robot 20 is thus suppressed without stopping the robot 20, even in a case where an abnormality has occurred in, for example, the end effector 50 of the robot 20 and/or a mechanism relating to the end effector 50, if the level of the abnormality is lower than the level at which corrective maintenance is required, the robot 20 can be operated safely while eliminating the necessity to perform predictive maintenance. This consequently makes it possible to reduce the work load of maintenance work performed on the robot 20.

Moreover, by additionally outputting the alarm in step S5, in a case where an abnormality of a level lower than the level at which corrective maintenance is required has occurred, the operation of the robot 20 can be suppressed without stopping the robot 20, and also, the user can be notified of the abnormality.

Furthermore, if it is determined in step S3 that the amount of deviation from the predetermined time (i.e., the deterioration index parameter) is greater than or equal to the second threshold (deterioration index parameter≥second threshold), the robot controller 70 receives that information, and in response thereto, executes step S6 to stop the robot 20. In this manner, the robot 20 can be stopped safely in a case where an abnormality of the level at which corrective maintenance is required has occurred.

Still further, by additionally outputting the alarm in step S6, in a case where an abnormality of the level at which corrective maintenance is required has occurred, the robot 20 can be stopped safely, and also, the user can be notified of the abnormality.

2. Embodiment 2

State Monitoring System 10

Figure 4:
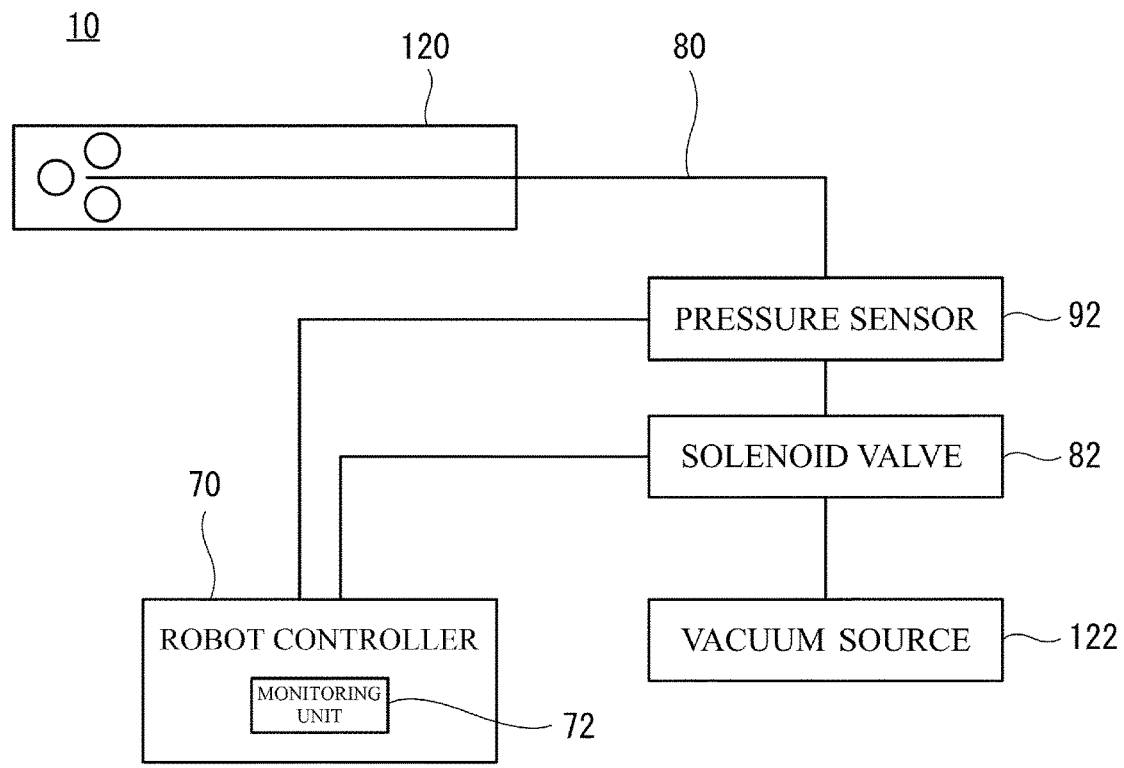
FIG. 4 is a schematic block diagram showing the configuration of an essential part of a robot to which a state monitoring system according to Embodiment 2 of the present invention is applied, the robot being configured to hold a workpiece by suction.

The state monitoring system 10 according to Embodiment 2 of the present invention is the same as the above-described state monitoring system 10 according to Embodiment 1, except that the end effector 50 of the state monitoring system 10 according to Embodiment 2 holds the semiconductor wafer W by suction. Therefore, in Embodiment 2, the same components as those described in Embodiment 1 are denoted by the same reference signs as those used in Embodiment 1, and repeating the same descriptions as well as redundant illustration is avoided. FIG. 4 is a schematic block diagram showing the configuration of an essential part of a robot to which the state monitoring system according to Embodiment 2 of the present invention is applied, the robot being configured to hold a workpiece by suction.

Similar to Embodiment 1 described above, the state monitoring system 10 according to Embodiment 2 of the present invention is intended for monitoring the state of the robot 20 configured to perform work on the semiconductor wafer W (workpiece). The state monitoring system 10 includes: a pressure sensor 92 (sensor) configured to obtain state data that indicates the state of a component included in the robot 20; and the monitoring unit 72 configured to monitor the state of the robot 20 by using a deterioration index parameter that is based on the state data. The pressure sensor 92 will be described below.

End Effector 50

The end effector 50 according to the present embodiment includes a suction part 120 intended for holding the semiconductor wafer W by suction. The suction part 120 is connected to an air hose 80 in order to switch the state of the interior of the suction part 120 into a vacuum state (or a state close to a vacuum state). The air hose 80 is connected to the solenoid valve 82 via the pressure sensor 92, and the solenoid valve 82 is connected to a vacuum source 122 and the robot controller 70. The solenoid valve 82 switches the state of the interior of the suction part 120 between a vacuum state and a non-vacuum state in accordance with instruction data from the robot controller 70. It should be noted that vacuum breaking may be performed at the same time as switching the state of the interior of the suction part 120 from a vacuum state into a non-vacuum state.

Monitoring Unit 72

The monitoring unit 72 according to the present embodiment monitors the state of the robot 20 by using a deterioration index parameter that is based on pressure data (state data) of the internal pressure of the suction part 120 of the end effector 50. In the present embodiment, the pressure data (state data) also serves as holding state data that indicates whether or not the end effector 50 is holding the semiconductor wafer W (workpiece) by suction. Similar to Embodiment 1 described above, the deterioration index parameter is the amount of deviation from the predetermined time that is required from when the robot controller 70 has transmitted instruction data to instruct the end effector 50 to hold the semiconductor wafer W until when the robot controller 70 receives the holding state data indicating that the end effector 50 is holding the semiconductor wafer W.

Hereinafter, one example of processes executed by the monitoring unit 72, and the details of the state data and the deterioration index parameter, are described mainly with reference to FIG. 3.

First, the monitoring unit 72 obtains the internal pressure of the suction part 120 of the end effector 50 from the pressure sensor 92, and derives a deterioration index parameter based on the obtained internal pressure (step S1).

Specifically, when the suction part 120 is not connected to the vacuum source 122 and the interior of the suction part 120 is not a vacuum state (nor a state close to a vacuum state), it means that the semiconductor wafer W is in the state of not being held by the end effector 50. In this state, the robot controller 70 transmits instruction data to the solenoid valve 82 to connect the suction part 120 to the vacuum source 122, and concurrently starts the timer.

Upon receiving the instruction data, the solenoid valve 82 performs a changeover of the valve to connect the suction part 120 to the vacuum source 122. Since holes formed in the suction part 120 are blocked by the semiconductor wafer W, the internal pressure of the suction part 120 and the air hose 80 drops. When the pressure sensor 92 detects that the internal pressure of the air hose 80 is lower than or equal to a predetermined value, the pressure sensor 92 transmits, to the monitoring unit 72, a suction signal indicating that the end effector 50 is holding the semiconductor wafer W by suction. The monitoring unit 72 receives the suction signal from the pressure sensor 92, and reads the timer value at the time. In the present embodiment, the amount of deviation of the timer value read at the time from the predetermined time serves as the deterioration index parameter.

Next, the monitoring unit 72 determines whether or not the amount of deviation from the predetermined time (i.e., the deterioration index parameter) is greater than a first threshold that is preset to a level lower than a level at which corrective maintenance is required (step S2). Here, if an abnormality occurs in the vacuum feeding system from the vacuum source 122 to the suction part 120, the amount of deviation from the predetermined time deviates from a predetermined value, i.e., becomes shorter or longer than the predetermined value. In the present embodiment, the upper limit value and the lower limit value of an allowable amount of deviation at the time from the predetermined time (the allowable amount of deviation is preset to a level lower than the level at which corrective maintenance is required) serve as the first threshold.

Since the processes executed in step S3 and thereafter are the same as those described above in Embodiment 1, the description thereof is not repeated herein.

Advantageous Effects

The state monitoring system 10 according to the present embodiment obtains the pressure data of the internal pressure of the suction part 120 of the end effector 50 from the pressure sensor 92 (i.e., obtains the holding state data that indicates whether or not the end effector 50 is holding the semiconductor wafer W by suction), and derives the deterioration index parameter based on the obtained data. Then, if the frequency of having determined that the deterioration index parameter is greater than the first threshold, which is preset to the level lower than the level at which corrective maintenance is required, is greater than the preset frequency threshold, the state monitoring system 10 suppresses the operation of the robot 20 without stopping the robot 20.

Since the operation of the robot 20 is thus suppressed without stopping the robot 20, even in a case where an abnormality has occurred in, for example, the end effector 50 of the robot 20 and/or a mechanism relating to the end effector 50, if the level of the abnormality is lower than the level at which corrective maintenance is required, the robot 20 can be operated safely while eliminating the necessity to perform predictive maintenance. This consequently makes it possible to reduce the work load of maintenance work performed on the robot 20.

3. Embodiment 3

State Monitoring System 10

Figure 5:
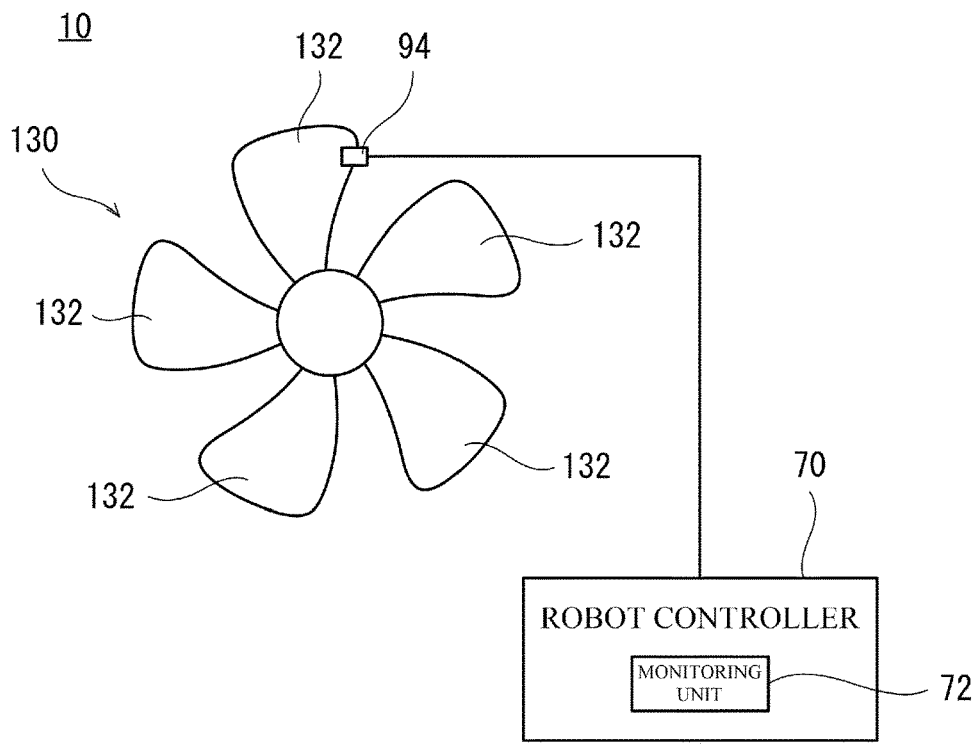
FIG. 5 is a schematic block diagram showing the configuration of an essential part of a robot to which a state monitoring system according to Embodiment 3 of the present invention is applied.

The state monitoring system 10 according to Embodiment 3 of the present invention is intended for monitoring the state of a fan 130 provided on the robot 20 configured to perform work on the workpiece. The state monitoring system 10 according to the present embodiment is configured in the same manner as the above-described state monitoring system according to Embodiment 1, except that the state monitoring system 10 according to the present embodiment includes the fan 130 and a fan sensor 94. Therefore, in the present embodiment, the same components as those described in Embodiment 1 are denoted by the same reference signs as those used in Embodiment 1, and repeating the same descriptions as well as redundant illustration is avoided. FIG. 5 is a schematic block diagram showing the configuration of an essential part of a robot to which the state monitoring system according to Embodiment 3 of the present invention is applied.

The state monitoring system 10 includes: the fan sensor 94 (sensor) configured to obtain state data that indicates the state of a component included in the robot 20; and the monitoring unit 72 configured to monitor the state of the robot 20 by using a deterioration index parameter that is based on the state data.

The robot 20 includes the fan 130, which includes a plurality of vanes 132. For example, the fan 130 is provided on a part of the robot 20, the part being close to a placing surface of the robot 20, in order to discharge dust or the like generated in the robot 20 to the outside.

The fan sensor 94 may include a light emitter and a light receiver. For example, when the plurality of vanes 132 of the fan 130 rotate, the light emitter emits a light beam to the vanes 132. The light receiver is provided such that the light emitter and the light receiver face each other, with the vanes 132 positioned in between. The light receiver receives the light beam emitted from the light emitter. For example, the fan sensor 94 detects whether or not the vanes 132 have rotated and passed a predetermined position in the fan 130 based on whether or not the light beam emitted from the light emitter is blocked by the vanes 132 before reaching the light receiver.

Monitoring Unit 72

The monitoring unit 72 according to the present embodiment monitors the state of the robot 20 by using a deterioration index parameter that is based on data (state data) that indicates whether or not the plurality of vanes 132 have rotated and passed the predetermined position in the fan 130. In the present embodiment, the deterioration index parameter is the amount of deviation from a predetermined number of rotations that indicates the number of rotations to be made by the plurality of vanes 132 during a predetermined time.

Hereinafter, one example of processes executed by the monitoring unit 72, and the details of the state data and the deterioration index parameter, are described mainly with reference to FIG. 3.

First, the monitoring unit 72 obtains, from the fan sensor 94, the state data that indicates whether or not the vanes 132 have rotated and passed the predetermined position in the fan 130, and derives, based on the state data, the amount of deviation from the predetermined number of rotations, which indicates the number of rotations to be made by the plurality of vanes 132 during the predetermined time (i.e., derives the deterioration index parameter) (step S1).

Next, the monitoring unit 72 determines whether or not the amount of deviation from the predetermined number of rotations (i.e., the deterioration index parameter) is greater than a first threshold that is preset to a level lower than a level at which corrective maintenance is required (step S2). Here, if an abnormality occurs in, for example, the fan 130 and/or a mechanism relating to the fan 130, the number of rotations made by the plurality of vanes 132 deviates from a predetermined value, i.e., becomes less or greater than the predetermined number of rotations. In the present embodiment, the upper limit value and the lower limit value of an allowable amount of deviation at the time from the predetermined number of rotations (the allowable amount of deviation is preset to a level lower than the level at which corrective maintenance is required) serve as the first threshold.

Since the processes executed in step S3 and thereafter are the same as those described above in Embodiment 1, the description thereof is not repeated herein.

Advantageous Effects

The state monitoring system 10 according to the present embodiment detects whether or not the plurality of vanes 132 have rotated and passed the predetermined position in the fan 130, and derives, based on data indicating the detection result, the amount of deviation from the predetermined number of rotations of the vanes 132 (i.e., derives the deterioration index parameter). Then, if the frequency of having determined that the deterioration index parameter is greater than the first threshold, which is preset to the level lower than the level at which corrective maintenance is required, is greater than the preset frequency threshold, the state monitoring system 10 suppresses the operation of the robot 20 without stopping the robot 20. Since the operation of the robot 20 is thus suppressed without stopping the robot 20, even in a case where an abnormality has occurred in, for example, the fan 130 of the robot 20 and/or a mechanism relating to the fan 130, if the level of the abnormality is lower than the level at which corrective maintenance is required, the robot 20 can be operated safely while eliminating the necessity to perform predictive maintenance. This consequently makes it possible to reduce the work load of maintenance work performed on the robot 20. It should be noted that the fan 130 is provided in order to discharge dust or the like generated in the robot 20 to the outside, and the generation of the dust can be reduced by suppressing the operation of the robot 20 without stopping the robot 20. Thus, the above-described advantageous effects can be exerted prominently.

4. Embodiment 4

State Monitoring System 10

Figure 6:
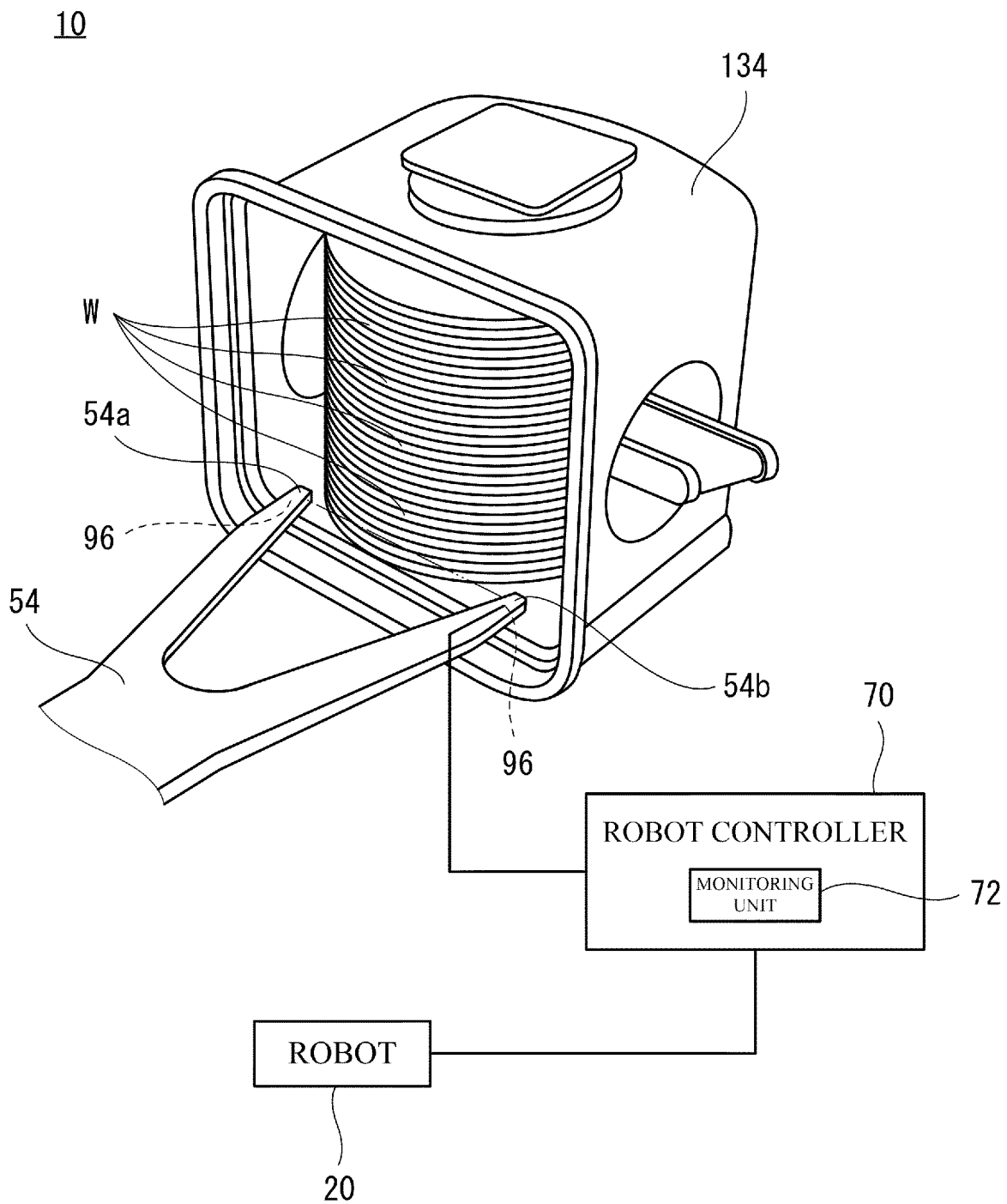
FIG. 6 is a schematic block diagram showing the configuration of an essential part of a robot to which a state monitoring system according to Embodiment 4 of the present invention is applied.

The state monitoring system 10 according to Embodiment 4 of the present invention monitors the state of the robot 20 by using a deterioration index parameter that is based on mapping data (state data) that indicates the placement state of the workpiece. The state monitoring system 10 according to the present embodiment is configured in the same manner as the above-described state monitoring system according to Embodiment 1, except that the state monitoring system 10 according to the present embodiment includes a mapping sensor 96. Therefore, in the present embodiment, the same components as those described in Embodiment 1 are denoted by the same reference signs as those used in Embodiment 1, and repeating the same descriptions is avoided. FIG. 6 is a schematic block diagram showing the configuration of an essential part of a robot to which the state monitoring system according to Embodiment 4 of the present invention is applied.

The state monitoring system 10 according to the present embodiment includes: the mapping sensor 96 (sensor) configured to obtain mapping data (state data) that indicates the placement state of the semiconductor wafer W (workpiece); and the monitoring unit 72 configured to monitor the state of the robot 20 by using a deterioration index parameter that is based on the mapping data.

The robot 20 is configured to hold each of a plurality of semiconductor wafers W, which are accommodated in a cassette 134 in a stacked manner, and perform work on the held semiconductor wafer W. The mapping sensor 96 is realized by, for example, a transmissive sensor including a light emitter and a light receiver. The Y-shaped end effector body 54 includes distal end portions, which are one distal end portion 54a and the other distal end portion 54b. The light emitter is provided at the one distal end portion 54a, and the light receiver is provided at the other distal end portion 54b. The light emitter emits a light beam to the light receiver. Upon receiving the light beam from the light emitter, the light receiver outputs a signal indicating that the light receiver has received the light beam. When a semiconductor wafer W is in the state of being accommodated in the cassette 134, a part of the semiconductor wafer W can be positioned in a gap region that is formed between the one distal end portion 54a and the other distal end portion 54b in their width direction Y. When the part of the semiconductor wafer W accommodated in the cassette 134 is positioned in the gap region, the light beam emitted from the light emitter is blocked by the semiconductor wafer W accommodated in the cassette 134. It should be noted that a transmissive sensor may be used as the mapping sensor as in this example, or a different sensor such as a reflective sensor may be used as the mapping sensor.

Monitoring Unit 72

The monitoring unit 72 according to the present embodiment monitors the state of the robot 20 by using a deterioration index parameter that is based on mapping data (state data) that indicates the placement state of the semiconductor wafer W. In the present embodiment, the deterioration index parameter is the amount of deviation between the mapping data and a predetermined placement state of the semiconductor wafer W.

Hereinafter, one example of processes executed by the monitoring unit 72, and the details of the state data and the deterioration index parameter, are described mainly with reference to FIG. 3.

First, the monitoring unit 72 obtains the mapping data of the semiconductor wafer W, and derives, based on the obtained data, the amount of deviation between the mapping data and the predetermined placement state of the semiconductor wafer W (i.e., derives the deterioration index parameter) (step S1).

Next, the monitoring unit 72 determines whether or not the amount of deviation (i.e., the deterioration index parameter) is greater than a first threshold that is preset to a level lower than a level at which corrective maintenance is required (step S2). Usually, the semiconductor wafers W have the same thickness; the height position or the like of the semiconductor wafers W accommodated in the cassette 134 is fixed; and each of the semiconductor wafers W accommodated in the cassette 134 is in the predetermined placement state. However, there may occur an abnormality that causes a change or changes in mechanisms that have influences on the placement state of each semiconductor wafer W (e.g., a change or changes in the installation position of the cassette 134, the shape of the end effector body 54, the position and the light intensity of the mapping sensor 96, etc.). As a result, deviation from the predetermined placement state occurs. In the present embodiment, the upper limit value and the lower limit value of an allowable amount of deviation at the time from the predetermined placement state (the allowable amount of deviation is preset to a level lower than the level at which corrective maintenance is required) serve as the first threshold.

Since the processes executed in step S3 and thereafter are the same as those described above in Embodiment 1, the description thereof is not repeated herein.

Advantageous Effects

The state monitoring system 10 according to the present embodiment detects the mapping data that indicates the placement state of the semiconductor wafer W, and derives, based on the detected data, the amount of deviation between the mapping data and the predetermined placement state of the semiconductor wafer W (i.e., derives the deterioration index parameter). Then, if the frequency of having determined that the deterioration index parameter is greater than the first threshold, which is preset to the level lower than the level at which corrective maintenance is required, is greater than the preset frequency threshold, the state monitoring system 10 suppresses the operation of the robot 20 without stopping the robot 20. Since the operation of the robot 20 is thus suppressed without stopping the robot 20, even in a case where an abnormality has occurred in, for example, a mechanism of the robot 20 that has an influence on the placement state of the semiconductor wafer W, if the level of the abnormality is lower than the level at which corrective maintenance is required, the robot 20 can be operated safely while eliminating the necessity to perform predictive maintenance. This consequently makes it possible to reduce the work load of maintenance work performed on the robot 20.

5. Variations

The state monitoring system 10 may be configured to monitor the state of the robot 20 by using a deterioration index parameter derived based on state data that is different from the state data used in the above-described embodiments. For example, the sensor may be an encoder configured to detect the rotational position of a motor. In this case, the deterioration index parameter may be the amount of deviation between the rotational position of the motor when the motor is stopped from rotating and the rotational position of the motor when a predetermined time has elapsed after the motor is stopped from rotating. Here, even when a brake is applied by stopping the motor from rotating, each shaft of the robot 20 inevitably rotates thereafter to some extent due to, for example, the weight of the robotic arm 30. In this variation, the upper limit value and the lower limit value of an allowable amount of deviation between the rotational positions of the motor at the time (the allowable amount of deviation is preset to a level lower than a level at which corrective maintenance is required) serve as the first threshold. Based on such first threshold, the state monitoring system 10 may monitor the state of the robot 20. Alternatively, the speed of communication with the encoder may be used as the deterioration index parameter, and the state monitoring system 10 may monitor the state of the robot 20 by determining whether or not an abnormality has occurred in the communication between the encoder and the robot controller 70.

The above embodiments have given the description of cases where the robot controller 70 includes the monitoring unit 72. However, this is merely a non-limiting example. Specifically, the monitoring unit 72 may be included in a monitoring controller that is a superordinate controller provided separately from the robot controller 70. It should be noted that in the case of outputting an alarm in step S5, in which the operation of the robot 20 is suppressed without stopping the robot 20, and in step S6, in which the robot is stopped, the robot controller 70 may output the alarm, or the monitoring controller may perform instruction control for outputting the alarm.

The state monitoring system 10 may further include: a storage device configured to store history data of results of execution by the monitoring unit 72; and an output device configured to output the history data. The history data of results of execution by the monitoring unit 72 herein may be, for example, as follows: deterioration index parameter values at different time points; time points at which the deterioration index parameter has become greater than the first threshold and the second threshold; the number of times the deterioration index parameter has become greater than the first threshold and the second threshold; time points at which the frequency of having determined that the deterioration index parameter is greater than the first threshold has become greater than the frequency threshold; and the number of times the frequency of having determined that the deterioration index parameter is greater than the first threshold has become greater than the frequency threshold. This makes it possible to perform maintenance work at suitable timings by checking the history data. It should be noted that in the case of handling the history data in such a way, such a process as outputting the history data may be executed by the robot controller 70, or may be executed by the aforementioned monitoring controller.

The above embodiments have given the description of cases where the monitoring unit 72 executes all of the steps S1 to S6 of the flowchart shown in FIG. 3. However, this is merely a non-limiting example. The monitoring unit 72 need not execute step S3, which is the step of further determining whether or not the deterioration index parameter is greater than the second threshold, and step S6, which is the step of stopping the robot 20 if it is determined in step S3 that the deterioration index parameter is greater than the second threshold. This makes it possible to reduce the processing load of the monitoring unit 72.

The above embodiments have given the description of cases where the state monitoring system 10 may output an alarm in step S5, which is the step of suppressing the operation of the robot 20 without stopping the robot 20, and in step S6, which is the step of stopping the robot. However, this is merely a non-limiting example. For example, the state monitoring system 10 may output an alarm if it is determined in step S2 that the deterioration index parameter is greater than the first threshold. Frequency thresholds, for example, two frequency thresholds, may be set in a stepwise manner, and the degree of suppressing the operation of the robot 20 may be changed in accordance with the set frequency thresholds (e.g., the speed of the robot 20 may be reduced in a stepwise manner). Similarly, frequency thresholds may be set in a stepwise manner, and the state monitoring system 10 may output an alarm each time the frequency of having determined that the deterioration index parameter is greater than the first threshold becomes greater than one of the frequency thresholds.

The preset thresholds (first threshold, second threshold, and frequency threshold) described in the above embodiments may be changed and reset as necessary in accordance with, for example, the status of work currently performed by the robot 20. At the time, the preset thresholds may be automatically changed, for example, by using a computer system (so-called "artificial intelligence (AI)") having self-learning functions for artificially realizing intellectual functions such as inference and judgement.

The above embodiments have given the description of cases where the processing is ended after executing step S5, which is the step of suppressing the operation of the robot 20 without stopping the robot 20. However, this is merely a non-limiting example. For example, also after executing step S5 to suppress the operation of the robot 20, the state monitoring system 10 may continue to obtain state data from the sensor, derive the deterioration index parameter based thereon, and if it is determined that the deterioration index parameter is greater than the second threshold, stop the robot 20. In this manner, the robot 20 can be operated more safely.

The above embodiments have given the description of cases where the workpiece is a semiconductor wafer W, and the robot 20 is installed in a clean room and performs the work of transferring the semiconductor wafer W. However, this is merely a non-limiting example. For example, the workpiece may be a food product, and the robot 20 may be installed at a packed lunch production site and configured to perform the work of packing lunchboxes with the food products.

The above embodiments have given the description of cases where the frequency threshold is a preset threshold relating to the number of times the deterioration index parameter becomes greater than the first threshold while the robot 20 repeats performing the work a predetermined number of times. However, this is merely a non-limiting example. For example, the frequency threshold may be a preset threshold relating to the number of times the deterioration index parameter becomes greater than the first threshold during a predetermined time.

From the foregoing description, numerous modifications and other embodiments of the present invention are obvious to a person skilled in the art. Therefore, the foregoing description should be interpreted only as an example and is provided for the purpose of teaching the best mode for carrying out the present invention to a person skilled in the art. The structural and/or functional details may be substantially altered without departing from the spirit of the present invention.

REFERENCE SIGNS LIST 10 state monitoring system
20 robot 22 base
24 lifting/lowering shaft
30 robotic arm
32 first arm
34 second arm
50 end effector
52 mounting plate
54 end effector body
56 first receiver
56a clamp portion
57 facing surface
58 second receiver
58a step
59 facing surface
59a through groove
60 pushing mechanism
62 cylinder
64 piston
66 rod
68 pusher
69 pushing surface
70 robot controller
72 monitoring unit
80 air hose
82 solenoid valve
84 compressor
90a advancement sensor
90b retraction sensor
92 pressure sensor
94 fan sensor
96 mapping sensor
120 suction part
122 vacuum source
130 fan
132 vane
134 cassette
W semiconductor wafer

The invention claimed is:

1. A state monitoring system for monitoring a state of a robot configured to perform work on a workpiece, the system comprising:
    a sensor configured to obtain state data that indicates either a state of a component included in the robot or a state of the workpiece; and
    a monitoring unit configured to monitor a state of the robot by using a deterioration index parameter that is based on the state data, wherein
    the monitoring unit executes:
        obtaining the state data from the sensor and deriving the deterioration index parameter based on the obtained state data;
        determining whether or not the deterioration index parameter is greater than a first threshold, wherein the first threshold is preset to a level lower than a level at which corrective maintenance is required;
        in response to determining that the deterioration index parameter is greater than the first threshold, further determining whether or not the deterioration index parameter is greater than a second threshold that is preset to the level at which the corrective maintenance is required;
        in response to determining that the deterioration index parameter is not greater than the second threshold, further determining whether or not a frequency of having determined that the deterioration index parameter is greater than the first threshold is greater than a preset frequency threshold;
        in response to determining that the frequency is greater than the frequency threshold, suppressing an operation of the robot without stopping the robot; and
        in response to determining that the deterioration index parameter is greater than the second threshold, stopping the robot,
    the robot includes:
        a robotic arm;
        an end effector mounted to the robotic arm, the end effector being configured to hold the workpiece and perform the work on the held workpiece; and
        a robot controller configured to control the robotic arm and the end effector,
    the state data is holding state data that indicates whether or not the end effector is holding the workpiece, and
    the deterioration index parameter is an amount of deviation between (i) an actual time from when the robot controller has transmitted instruction data to instruct the end effector to hold the workpiece until when the robot controller receives the holding state data indicating that the end effector is holding the workpiece and (ii) a predetermined time that is required from when the robot controller has transmitted the instruction data until when the robot controller receives the holding state data.

2. The state monitoring system according to claim 1, wherein
    the monitoring unit executes suppressing the operation of the robot without stopping the robot by reducing a speed or acceleration of the robot.

3. The state monitoring system according to claim 1, wherein
    the frequency threshold is a preset threshold relating to the number of times the deterioration index parameter becomes greater than the first threshold while the robot repeats performing the work a predetermined number of times.

4. The state monitoring system according to claim 1, wherein
    the frequency threshold is a preset threshold relating to the number of times the deterioration index parameter becomes greater than the first threshold during a predetermined time.

5. The state monitoring system according to claim 1, wherein
    the end effector moves a piston in a cylinder to hold the workpiece by chucking, and
    the sensor is a position sensor configured to detect a position of the piston in the cylinder.

6. The state monitoring system according to claim 1, wherein
    the end effector reduces an internal pressure of a suction part to hold the workpiece by suction, and
    the sensor is a pressure sensor configured to detect the internal pressure of the suction part.

7. The state monitoring system according to claim 1, wherein
    the workpiece is a semiconductor wafer, and
    the robot is installed in a clean room.

8. The state monitoring system according to claim 1, wherein
    in suppressing the operation of the robot without stopping the robot, the monitoring unit additionally outputs an alarm.

9. The state monitoring system according to claim 1, wherein in stopping the robot, the monitoring unit additionally outputs an alarm.

10. The state monitoring system according to claim 1, further comprising:
a storage device configured to store history data of results of execution by the monitoring unit; and
an output device configured to output the history data.

11. A state monitoring system for monitoring a state of a robot configured to perform work on a workpiece, the system comprising:
a sensor configured to obtain state data that indicates either a state of a component included in the robot or a state of the workpiece; and
a monitoring unit configured to monitor a state of the robot by using a deterioration index parameter that is based on the state data, wherein
the robot includes a fan including a plurality of vanes,
the sensor is a fan sensor configured to detect whether or not the plurality of vanes have rotated and passed a predetermined position in the fan,
the deterioration index parameter is an amount of deviation between (i) an actual number of rotations by the plurality of vanes during a predetermined time and (ii) a predetermined number of rotations that indicates the number of rotations to be made by the plurality of vanes during the predetermined time, and
the monitoring unit executes:
obtaining the state data from the sensor and deriving the deterioration index parameter based on the obtained state data;
determining whether or not the deterioration index parameter is greater than a first threshold, wherein the first threshold is preset to a level lower than a level at which corrective maintenance is required;
in response to determining that the deterioration index parameter is greater than the first threshold, further determining whether or not the deterioration index parameter is greater than a second threshold that is preset to the level at which the corrective maintenance is required;
in response to determining that the deterioration index parameter is not greater than the second threshold, further determining whether or not a frequency of having determined that the deterioration index parameter is greater than the first threshold is greater than a preset frequency threshold;
in response to determining that the frequency is greater than the frequency threshold, suppressing an operation of the robot without stopping the robot; and
in response to determining that the deterioration index parameter is greater than the second threshold, stopping the robot.

12. The state monitoring system according to claim 11, wherein
the monitoring unit executes suppressing the operation of the robot without stopping the robot by reducing a speed or acceleration of the robot.

13. The state monitoring system according to claim 11,
the frequency threshold is a preset threshold relating to the number of times the deterioration index parameter becomes greater than the first threshold while the robot repeats performing the work a predetermined number of times.

14. The state monitoring system according to claim 11, wherein
the frequency threshold is a preset threshold relating to the number of times the deterioration index parameter becomes greater than the first threshold during a predetermined time.

15. A state monitoring method of monitoring a state of a robot configured to perform work on a workpiece, the method comprising:
obtaining state data from a sensor and deriving a deterioration index parameter based on the obtained state data, the state data indicating either a state of a component included in the robot or a state of the workpiece;
determining whether or not the deterioration index parameter is greater than a first threshold, wherein the first threshold is preset to a level lower than a level at which corrective maintenance is required;
in response to determining that the deterioration index parameter is greater than the first threshold, further determining whether or not the deterioration index parameter is greater than a second threshold that is preset to the level at which the corrective maintenance is required;
in response to determining that the deterioration index parameter is not greater than the second threshold, further determining whether or not a frequency of having determined that the deterioration index parameter is greater than the first threshold is greater than a preset frequency threshold;
in response to determining that the frequency is greater than the frequency threshold, suppressing an operation of the robot without stopping the robot; and
in response to determining that the deterioration index parameter is greater than the second threshold, stopping the robot, wherein
the robot includes:
a robotic arm;
an end effector mounted to the robotic arm, the end effector being configured to hold the workpiece and perform the work on the held workpiece; and
a robot controller configured to control the robotic arm and the end effector,
the state data is holding state data that indicates whether or not the end effector is holding the workpiece, and
the deterioration index parameter is an amount of deviation between (i) an actual time from when the robot controller has transmitted instruction data to instruct the end effector to hold the workpiece until when the robot controller receives the holding state data indicating that the end effector is holding the workpiece and (ii) a predetermined time that is required from when the robot controller has transmitted the instruction data until when the robot controller receives the holding state data.

16. A state monitoring method of monitoring a state of a robot configured to perform work on a workpiece, the method comprising:
obtaining state data from a sensor and deriving a deterioration index parameter based on the obtained state data, the state data indicating either a state of a component included in the robot or a state of the workpiece;
determining whether or not the deterioration index parameter is greater than a first threshold, wherein the first threshold is preset to a level lower than a level at which corrective maintenance is required;
in response to determining that the deterioration index parameter is greater than the first threshold, further determining whether or not the deterioration index parameter is greater than a second threshold that is preset to the level at which the corrective maintenance is required;

in response to determining that the deterioration index parameter is not greater than the second threshold, further determining whether or not a frequency of having determined that the deterioration index parameter is greater than the first threshold is greater than a preset frequency threshold;

in response to determining that the frequency is greater than the frequency threshold, suppressing an operation of the robot without stopping the robot; and in response to determining that the deterioration index parameter is greater than the second threshold, stopping the robot, wherein the robot includes a fan including a plurality of vanes, the sensor is a fan sensor configured to detect whether or not the plurality of vanes have rotated and passed a predetermined position in the fan, and the deterioration index parameter is an amount of deviation between (i) an actual number of rotations by the plurality of vanes during a predetermined time and (ii) a predetermined number of rotations that indicates the number of rotations to be made by the plurality of vanes during the predetermined time.

* * * * *